United States Patent [19]

Lee et al.

[11] Patent Number: 5,659,519
[45] Date of Patent: Aug. 19, 1997

[54] BOOSTING VOLTAGE GENERATOR OF SEMICONDUCTOR MEMORY DEVICE

[75] Inventors: Hyun-Seok Lee; Soo-In Cho, both of Seoul, Rep. of Korea

[73] Assignee: Samsung Electronics Co., Ltd., Suwon, Rep. of Korea

[21] Appl. No.: 585,597

[22] Filed: Jan. 16, 1996

[30] Foreign Application Priority Data

Jan. 16, 1995 [KR] Rep. of Korea .................. 641/1995

[51] Int. Cl.$^6$ .................................................. G11C 11/40
[52] U.S. Cl. .......................... 365/230.06; 365/189.09; 365/226
[58] Field of Search ............................................. 365/226

[56] References Cited

U.S. PATENT DOCUMENTS

| 3,942,047 | 3/1976 | Buchanan | 307/297 |
| 4,862,415 | 8/1989 | Nakano | 365/226 |
| 5,103,113 | 4/1992 | Inui et al. | 365/226 |
| 5,179,539 | 1/1993 | Horiguchi et al. | 365/226 |
| 5,289,425 | 2/1994 | Horiguchi et al. | 365/189.09 |
| 5,291,441 | 3/1994 | Kondo | 365/226 |

OTHER PUBLICATIONS

Furutani et al., "An Adjustable Output Driver with a . . . ," IEEE Journal of Solid State Circuits, vol. 29, No. 3, pp. 308–310 (Mar. 1994).

*Primary Examiner*—David C. Nelms
*Assistant Examiner*—Michael T. Tran
*Attorney, Agent, or Firm*—Cushman Darby & Cushman, IP Group Of Pillsbury Madison & Sutro LLP

[57] ABSTRACT

A semiconductor memory device including at least two boosting voltage circuits which independently boost a supply voltage power level to a boosted voltage power level. A plurality of memory cell arrays each input the supply voltage power and store information therein. Driving circuits are connected to each of the memory cell arrays and supply the boosted voltage power to the memory cell arrays, the number of driving circuits preferably corresponding to the number of the boosting voltage circuits.

9 Claims, 2 Drawing Sheets

5,659,519

BOOSTING VOLTAGE GENERATOR OF SEMICONDUCTOR MEMORY DEVICE

BACKGROUND OF THE INVENTION

1. Field of the Invention

The present invention relates to a semiconductor memory device and, more particularly, to a semiconductor memory device having a plurality of boosting voltage generators, each of which independently supplies a boosted voltage to each of a plurality of memory cell arrays.

2. Description of the Related Art

The threshold voltage of a transistor has a direct effect on the function and characteristic of the circuits which employ it. When an input voltage is transmitted to an arbitrary terminal through a transistor, the input voltage drops by the threshold voltage of the transistor. Hence, a voltage difference between the input voltage and output voltage is caused by the threshold voltage of the transistor. Therefore, when directly outputting an applied voltage to a desired terminal, the voltage supplied to the gate electrode of the transistor should be high in order to reduce the voltage drop caused by the threshold voltage of the transistor.

Semiconductor memory devices use a boosting voltage (hereinafter, referred to as Vpp) generator which generates a boosted voltage higher than a power supply voltage Vcc and thus has a voltage level of Vcc+α. A representative example of such a boosted voltage in the semiconductor memory device is a word line voltage, which is supplied to the gate of a memory cell transistor and allows reading and storage of information to and from a cell capacitor, respectively. With a boosted word line voltage, the voltage drop caused due to the threshold voltage of the cell transistor is compensated for and the information can be transmitted without any change due to threshold voltage losses of the memory cell transistor.

Dynamic random access memory (DRAM) devices perform a refresh operation during set periods to maintain the information stored in the cell capacitor. This refresh operation needs to be performed on all the memory cell arrays included in the DRAM. Thus, the larger the memory capacity of the semiconductor memory device, the greater the number of simultaneously activated word lines.

FIG. 1 is a circuit diagram showing a configuration of a single $V_{pp}$ generator in a conventional semiconductor memory device. Memory cell arrays MCA1–MCA8 respectively include a plurality of cell capacitors and cell transistors. Eight or more memory cell arrays can be provided. Word line drivers WD1–WD8 supply the Vpp voltage to the word lines WL1–WL8 which each select memory cells in each of the memory cell arrays MCA1–MCA8, each word line driver being connected to gate electrodes of memory cell transistors in each of the memory cell arrays MCA1–MCA8. Therefore, a plural number of word lines proportional to the number of the memory cells are provided in each of the memory cell arrays. The Vpp generator VPG generates the Vpp voltage and supplies it to each of word line drivers WD1–WD8, thereby simultaneously selecting the word lines WL1–WL8.

If a plurality of word lines are simultaneously activated and only a single Vpp generator is driven within the device, a resistance bridge as shown in the memory cell array MCA1 of FIG. 1 may undesirably occur. Such a resistance bridge is frequently formed when a metal becomes covered with dust or a contaminant before an etching process is executed, such that the, metal between two adjacent word lines is not etched during the execution of the etching process and the lines are shorted together.

FIG. 2 is a detailed circuit diagram showing the undesirable circuit characteristics that may occur when resistance bridge RB is formed between adjacent word lines. The Vpp generator VPG supplies the Vpp voltage to the word line driving circuit WDi and WDj, respectively. The word line driver WDi is comprised of a PMOS transistor Pi and an NMOS transistor Ni which are connected in serial between a Vpp voltage terminal and a ground voltage and connected commonly to a word line selection signal φWSi at the gate electrodes thereof. The Vpp voltage driving the word line driver WDi is applied to the word line WLi. A cell transistor MCi and a cell capacitor CCi, which are connected in series between a bit line BLi and ground, serve as a memory cell for storing information, the cell transistor MCi hailing a gate electrode connected to the word line WLi. The word line driver WDj is comprised of a PMOS transistor Pj and an NMOS transistor Nj which are connected in series between the Vpp voltage terminal and a ground voltage and connected commonly to a word line selection signal φWSj at the gate electrodes thereof. The Vpp voltage driving the word line driver WDj is applied to the word line WLj. A cell transistor MCj and a cell capacitor CCj, which are connected in series between a bit line BLj and the ground voltage, serve as a memory cell for storing information, the cell transistor MCj having a gate electrode connected to the word line WLj. Also, resistance bridge RB connects the word line WLi and WLj, which results in an undesirable abnormal connection therebetween.

During normal operation, the word line WLi is selected, the word line selection signal φWSi is generated at a logic "low" state. Since the word line driving circuit WDi has an inverter structure, the PMOS transistor Pi is turned ON and the NMOS transistor Ni is turned OFF. As a result, the Vpp voltage generated in the Vpp generator VPG is supplied to the word line WLi. Sequentially, the cell trasistor MCi is mined ON and the information stored in the cell capacitor CCi is output to the bit line BLi. Since the information signal has a minute voltage, the cell transistor MCi is turned ON by the Vpp voltage and the information signal is output to the bit line BLi without any voltage drop. The voltage of the information signal is added to the voltage of precharged bit line BLi and the bit line BLi thus reaches a voltage that results from the addition of these voltages. Since the word line WLj adjacent to the word line WLi should not be selected, the word line selection signal φWSj is generated at a logic "high" state. Because the word line driver WDj also has an inverter structure, the PMOS transistor Pj is turned OFF and the NMOS transistor Nj is turned ON. As a result, the Vpp voltage generated in the Vpp generator VPG is not normally supplied to the word line WLj. Thus, the cell trasistor MCj is turned OFF and the information signal stored in the cell capacitor CCj is not output to the bit line BLj and the bit line BLj maintains its precharged state.

When the word lines WLi and WLj are undesirably connected by the resistance bridge RB, the current generated by the Vpp voltage forms a current path flowing from the Vpp generator VPG through the following elements: the PMOS transistor Pi of the word line driver WDi, the word line WLi, the resistance bridge RB, the word line WLj, the NMOS transistor Nj of the word line driver WDj and the ground voltage. When such an undesirable current path is formed by the resistance bridge RB, the level of Vpp voltage falls. Therefore, if only a single Vpp generator VPG as shown in FIG. 1 is used, the voltages of all drivers using the Vpp voltage are accordingly lowered and normal operation cannot be performed in many instances. More particularly, since the resistance bridge RB causes the Vpp voltage to be lower than desired, a threshold voltage of the cell transistor MCi is added to the voltage of the information signal such that the information signal cannot be completely transmitted and thereby a malfunction is caused.

When the memory cell is accessed as shown in FIG. 1, eight word lines WL1 to WL8 are simultaneously selected. At this time, if a resistance bridge in the activated word line WL1, defects on all of the activated word lines WL2 to WL8 can exist. A conventional semiconductor memory device replaces defective word lines with redundant word lines. As a result, when only a single word line has a defect, the remaining normal word lines must be considered to be defective and thus must be replaced by redundant word lines, which does not allow efficient defect repair operation.

SUMMARY OF THE INVENTION

It is an object of the present invention to provide a semiconductor memory device having at least two Vpp generators which is capable of effectively accessing information stored in memory cells.

It is another object of the present invention to provide a semiconductor memory device having a plurality of Vpp generators allow for effective defective word line repair operations, the Vpp generators being independently disposed in each memory cell array.

To achieve these and other objects, the present invention provides a semiconductor memory device including at least two boosting voltage circuits which independently boost a supply voltage power level to a boosted voltage power level. A plurality of memory cell arrays each input the supply voltage power and store information therein. Driving circuits are connected to each of the memory cell arrays and supply the boosted voltage power to the memory cell arrays, the number of driving circuits preferably corresponding to the number of the boosting voltage circuits.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, wherein.

DESCRIPTION OF THE PREFERRED EMBODIMENT(S)

Figure 3:
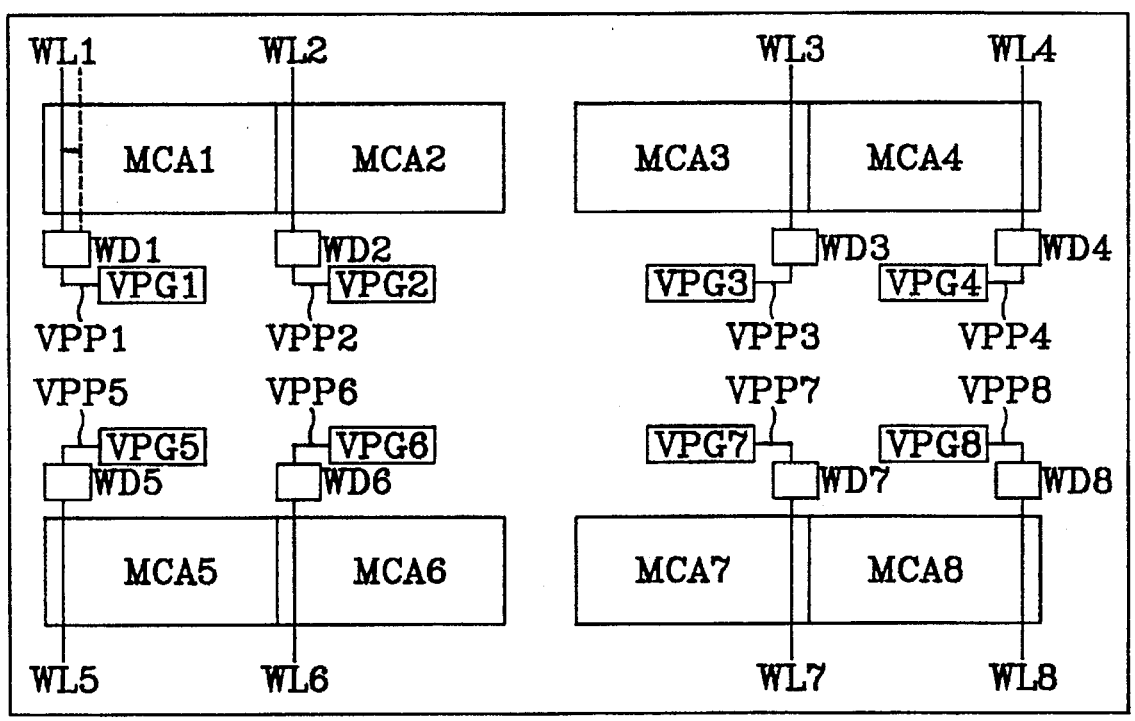
FIG. 3 is a circuit diagram showing a configuration of a semiconductor memory device according to the present invention, having eight Vpp generators, each disposed in one of the memory cell arrays.

FIG. 3 illustrates eight Vpp generators VPG1–VPG8, which each independently supply the Vpp voltage to each of eight word lines activated in one period that corresponds to the time need to store information or read information from the memory cells. Each of memory cell arrays MCA1–MCA8 includes a plurality of cell capacitors and cell transistors associated with each word line, and inputs a power supply voltage as an operating voltage. The number of memory cell arrays that can be provided is, of course, variable. Word line drivers WD1–WD8 each supply the Vpp voltage to the word lines WL1–WL8 which select certain of the memory cells in the memory cell arrays MCA1–MCAS. Each word line driver is connected to a gate electrode of the memory cell transistors in one of the memory cell arrays MCA1–MCA8 associated with that word line. Therefore, a plural number of word lines proportional to the number of the memory cells are provided in the memory cell arrays. The Vpp generators VPG1–VPG8 each input the power supply voltage and generate the Vpp1–Vpp8 voltages, which are supplied to each of word line drivers WD1–WD8.

When one word line from each of the memory cell arrays are simultaneously in one period, each of the Vpp1–Vpp8 voltages is independently supplied to respective word lines WL1–WL8 in each of memory cell arrays MCA1–MCA8. In a DRAM device, for example, when the eight word lines WL1–WL8 are simultaneously selected and activated for a refresh operation, each of the Vpp1–Vpp8 voltages generated from the Vpp generators VPG1–VPG8 is supplied to the word line drivers WD1–WD8.

Figure 1:
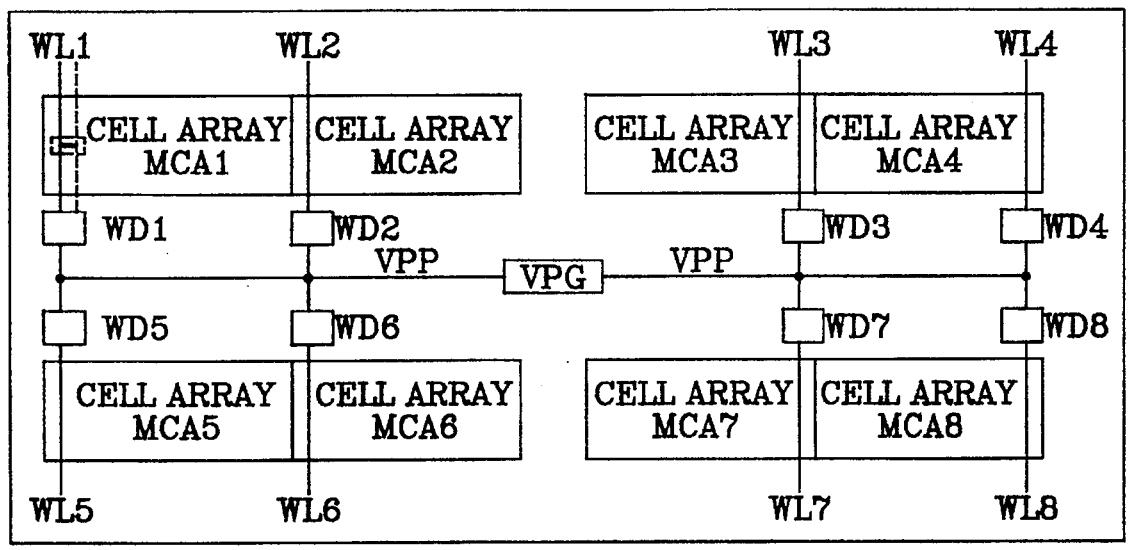
FIG. 1 is a circuit diagram showing a configuration of a single Vpp generator in a conventional semiconductor memory device.
Figure 2:
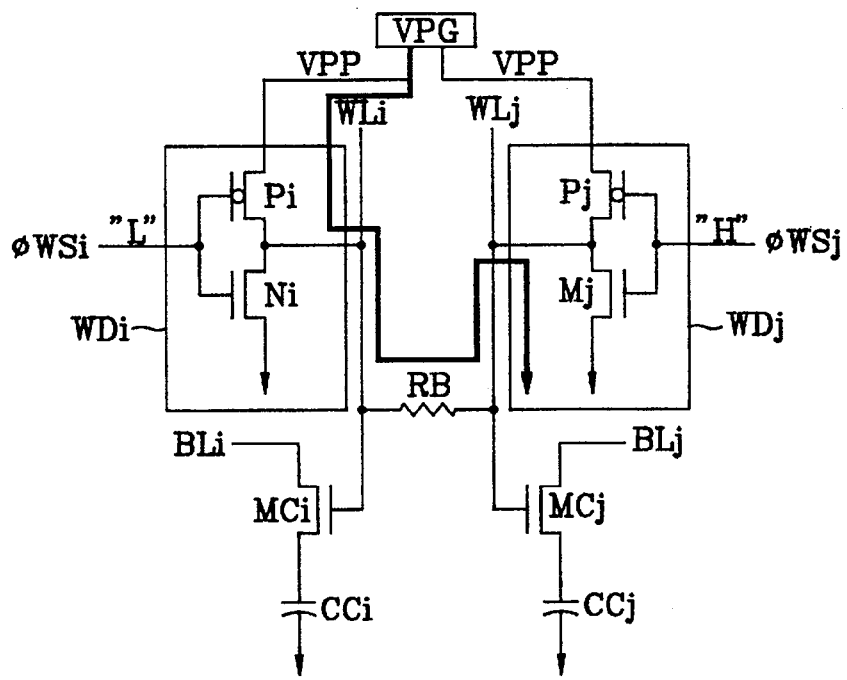
FIG. 2 is a detailed circuit diagram showing undesirable resistance bridge formed between adjacent word lines.

If an undesired resistance bridge such as shown in FIG. 2 is formed, since the Vpp1–Vpp8 voltages are separately used, as shown in FIG. 3, the presence of the resistance bridge does not have any effect on the nondefective word lines. Thus, when word lines WL1–WL8 are activated, even though the word line WL1 is defective, the remaining word lines WL2–WL8 operate normally. Thus, upon the defective word line repair operation, only the word line WL1 is repaired. When the number of Vpp generators VPG correspond to the number of word lines activated and each Vpp generator is capable of independently supplying the Vpp voltage, advantage occurs in accessing the memory cell and the ability to more selectively repair defective word lines. However, such a number Vpp generators uses a large chip area, thereby making it difficult to practically utilize.

Figure 4:
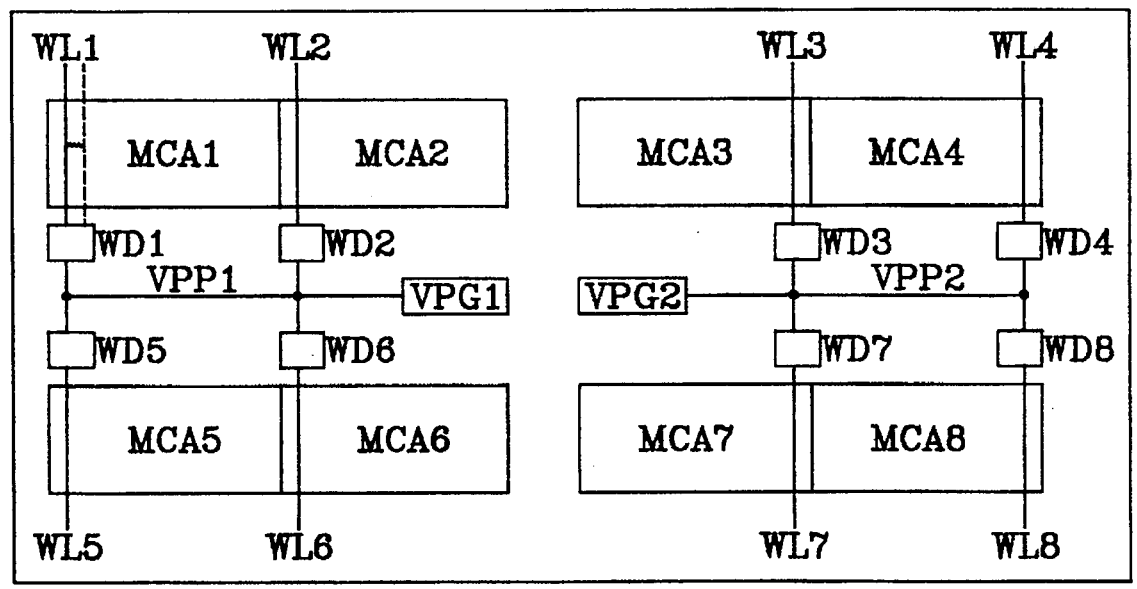
FIG. 4 is a circuit diagram showing another configuration of a semiconductor memory device according to the present invention having two Vpp generators, each associated with half of the memory cell arrays.

In FIG. 4, two Vpp generators VPG1 and VPG2 are provided. Each of memory cell arrays MCA1–MCA8 includes cell capacitors and cell transistors, and input a power supply voltage as an operating voltage. Eight or more memory cell arrays can be provided. Word line drivers WD1–WD8 supply the Vpp voltage to the word lines WL1–WL8 which select certain of the memory cells in the memory cell arrays MCA1–MCA8 corresponding to those to which the word line driver is connected to a gate electrode of a memory cell transistor. Thus, a plural number of word lines proportional to the number of the memory cells are provided in each of the memory cell arrays. The Vpp generators VPG1 and VPG2 respectively generate Vpp1 and Vpp2 voltages, and supply the generated Vpp1 and Vpp2 voltages to the word line drivers WD1–WD8. The word line drivers WD1–WD8 are divided into two groups. Each group inputs on of the Vpp1 and Vpp2 voltages. In the FIG. 4 embodiment, the word line drivers WD1, WD2, WD5 and WD6 constitute one group and thus input the Vpp1 voltage, and the word line drivers WD3, WD4, WD7 and WD8 constitute the other group and thus input the Vpp2 voltage. In this embodiment, if the resistance bridge shown in FIG. 2 undesirably exists, activated word lines to which the same Vpp is supplied are considered defective. In other words, in the FIG. 4 embodiment, when the word line WL1 of the memory cell array MCA1 is defective, since the word lines WL2, WL5, WL6 can be activated simultaneously with the word line WL1, these word lines must be considered defective, but the remaining nondefective word lines WL3, WL4, WL7 and WL8 are considered nondefective.

In the foregoing description, the number of the Vpp generators is 2 or 8, but may be freely set by the number simultaneously activated in one read or write period. Alternatively, the number of Vpp generators may be selected by a designer corresponding to some ratio other than one to each activated word line when a maximum number of word lines are simultaneously activated or one for half of the memory cell arrays to assist in enhancing overall performance of the memory device.

As set forth in the above, the present invention can provide a semiconductor memory device having at least two Vpp generators effectively access information stored in memory cells. In addition, the present invention can provide a semiconductor memory device having a plurality of Vpp generators which allows for effective defect repair operations, the Vpp generators being independently disposed in each of memory cell arrays.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A portion of a single chip semiconductor memory device comprising:

at least first and second boosting voltage circuits, which each independently boost a first voltage having a first voltage level to a second voltage having a second voltage level that is greater than said first voltage level;

a plurality of memory cell arrays that input said second voltage as operational power and for storing information; and a plurality of driving circuits, each driving circuit connected to a different one of said memory cell arrays for supplying said second voltage to said memory cell arrays, said plurality of driving circuits divided into first and second driving circuit groups, said first driving circuit group inputting said second voltage from said first boosting voltage circuit and said second driving circuit group inputting said second voltage from said second boosting voltage circuit.

2. The semiconductor memory device as defined in claim 1, wherein each of said driving circuits is a word line driving circuit which supplies a boosted word line voltage to said memory array.

3. The semiconductor memory device as defined in claim 2, wherein said first voltage is a power supply voltage and said second voltage is said boosted word line voltage.

4. The semiconductor memory device as defined in claim 1, wherein said first voltage levels of respective ones of said first and second boosting voltage circuits are equal to each other and said second voltage levels of respective ones of said boosting voltage circuits are equal to each other.

5. A portion of a single chip semiconductor memory device comprising:

a plurality of memory cell arrays, each memory cell array inputting a first voltage as operational power and containing a plurality of memory cells for storing information and a plurality of word lines for selecting said memory cells;

a plurality of boosting voltage circuits which each independently boost a first voltage having a first voltage level to a second voltage having a second voltage level that is greater than said first voltage level, said plurality corresponding to a maximum number of said word lines that are activated in one period; and a plurality of driving circuits, each driving circuit connected to a different one of said memory cell arrays for supplying said second voltage to said memory cell arrays, said plurality of driving circuits divided into a plurality of driving circuit groups, said plurality corresponding in number to said number of said plurality of boosting voltage circuits, each of said plurality of driving circuit groups inputting said second voltage from a different one of said plurality of driving circuits.

6. The semiconductor memory device as defined in claim 5, wherein said first voltage is a power supply voltage, and said second voltage is a boosted word line voltage.

7. The semiconductor memory device as defined in claim 5, wherein said number of said boosting voltage circuits is eight.

8. The semiconductor memory device as defined in claim 7, wherein said first voltage is a power supply voltage, and said second voltage is a boosted word line voltage.

9. The semiconductor memory device as defined in claim 5, wherein said first voltage levels of respective ones of said boosting voltage circuits are equal to each other and said second voltage levels of respective ones of said boosting voltage circuits are equal to each other.

\* \* \* \* \*